(12) United States Patent
Kosuru et al.

(10) Patent No.: US 10,636,455 B2
(45) Date of Patent: Apr. 28, 2020

(54) ENHANCED NVDIMM ARCHITECTURE (71) Applicant: International Business Machines Corporation, Armonk, NY (US)

(72) Inventors: Trinadhachari Kosuru, Bangalore (IN); Janani Swaminathan, Chennai (IN); Saravanan Sethuraman, Bangalore (IN); Adam J. McPadden, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/033,385

(22) Filed: Jul. 12, 2018

(65) Prior Publication Data

US 2020/0020360 A1    Jan. 16, 2020

(51) Int. Cl.
| | | |
|---|---|---|
| *G11C 5/04* | (2006.01) | |
| *G11C 14/00* | (2006.01) | |
| *G06F 3/06* | (2006.01) | |
| *G06F 12/02* | (2006.01) | |
| *G11C 16/04* | (2006.01) | |

(52) U.S. Cl.
CPC .............. *G11C 5/04* (2013.01); *G06F 3/0659* (2013.01); *G06F 3/0685* (2013.01); *G06F 12/0246* (2013.01); *G11C 14/0018* (2013.01); *G11C 16/0408* (2013.01)

(58) Field of Classification Search
CPC ... G11C 5/04; G11C 14/0018; G11C 16/0408; G06F 3/0685; G06F 12/0246; G06F 3/0659
See application file for complete search history.

(56) References Cited

U.S. PATENT DOCUMENTS

| | | | |
|---|---|---|---|
| 8,380,942 B1 * | 2/2013 | Corddry | G06F 12/0246 |
| | | | 711/154 |
| 8,949,502 B2 | 2/2015 | McKnight et al. | |

(Continued)

FOREIGN PATENT DOCUMENTS

| | | |
|---|---|---|
| WO | 2016064772 A1 | 4/2016 |
| WO | 2016209458 A1 | 12/2016 |

OTHER PUBLICATIONS

Gervasi et al., "Overcoming System Memory Challenges with Persistent Memory and NVDIMM-P," JEDEC Server Forum 2017, Global Standards for the Microelectronics Industry, pp. 1-14.

(Continued)

*Primary Examiner* — David Yi
*Assistant Examiner* — Dustin B. Fulford
(74) *Attorney, Agent, or Firm* — James L. Olsen (57) ABSTRACT

Aspects of the present disclosure relate to a memory module having a volatile memory, a high speed non-volatile memory, and a non-volatile memory. The memory module can allow write mirroring to the volatile memory and high speed non-volatile memory simultaneously. An I/O request is received. A determination is made whether the I/O request is a write or a read. In response to determining that the I/O request is a read, data included in the high speed non-volatile memory is transferred to the non-volatile memory. In response to determining that the I/O request is a write, at least one location to write data of the write is determined based on decoding bits of the write command. The data of the write can then be written to the at least one location.

20 Claims, 5 Drawing Sheets

(56) References Cited

U.S. PATENT DOCUMENTS

| | | | |
|---|---|---|---|
| 9,817,610 B1 | 11/2017 | Shallal et al. | |
| 9,880,754 B2 | 1/2018 | Berke | |
| 2010/0174853 A1* | 7/2010 | Lee | G06F 12/0246 |
| | | | 711/103 |
| 2012/0131253 A1 | 5/2012 | McKnight et al. | |
| 2012/0159016 A1* | 6/2012 | Morita | G06F 13/1673 |
| | | | 710/33 |
| 2013/0086309 A1 | 4/2013 | Lee et al. | |
| 2016/0011802 A1 | 4/2016 | Berke | |
| 2016/0306822 A1* | 10/2016 | Waghulde | G06F 16/184 |
| 2017/0212835 A1 | 6/2017 | Hu et al. | |
| 2017/0228190 A1 | 8/2017 | Guddekoppa | |
| 2018/0067660 A1* | 3/2018 | Yamamoto | G06F 3/0616 |
| 2019/0050341 A1* | 2/2019 | Veal | G06F 12/10 |

OTHER PUBLICATIONS

Sainio, A., "NVDIMM—Changes Are Here So What's Next?" In-Memory Computing, Summit 2016, pp. 1-22.

\* cited by examiner

ENHANCED NVDIMM ARCHITECTURE

BACKGROUND

The present disclosure relates generally to the field of data storage, and more particularly to memory module data storage.

Dual in-line memory modules (hereinafter "DIMMs") can include one or more memory chips (e.g., Dynamic Random Access Memory (DRAM)) for data storage. DRAM is commonly included in DIMMs due to its relatively high-performance and low-cost. DRAM chips can include a plurality of integrated circuits and capacitors for data storage. The capacitors of each DRAM cell can store a charge corresponding to a bit storage value.

SUMMARY

Aspects of the present disclosure relate to a memory module having a volatile memory, a high speed non-volatile memory (NVM), and a non-volatile memory. An I/O request can be received. A determination can be made whether the I/O request is a write or a read. In response to determining that the I/O request is a read, data included in the high speed NVM can be transferred to the non-volatile memory. In response to determining that the I/O request is a write, at least one location to write data of the write can be determined based on decoding bits of the write command. The data of the write can then be written to the at least one location.

Embodiments further include a memory module having at least one volatile memory, at least one high speed NVM, and at least one non-volatile memory. A write request can be received, and bits of the write request can be decoded. Based on the decoded bits, a determination can be made that the data of the write request should be mirrored to the at least one high speed NVM and the at least one volatile memory simultaneously. A determination can then be made whether to transfer the data of the at least one high speed NVM to the non-volatile memory. Based on the determination, the data of the at least one high speed NVM can be transferred to the non-volatile memory. The data of the at least one high speed NVM can then be flushed. The data of the write request can then be written to the at least one high speed NVM and the at least one volatile memory simultaneously.

The above summary is not intended to describe each illustrated embodiment or every implementation of the present disclosure.

BRIEF DESCRIPTION OF THE DRAWINGS

The drawings included in the present disclosure are incorporated into, and form part of, the specification. They illustrate embodiments of the present disclosure and, along with the description, serve to explain the principles of the disclosure. The drawings are only illustrative of typical embodiments and do not limit the disclosure.

While the embodiments described herein are amenable to various modifications and alternative forms, specifics thereof have been shown by way of example in the drawings and will be described in detail. It should be understood, however, that the particular embodiments described are not to be taken in a limiting sense. On the contrary, the intention is to cover all modifications, equivalents, and alternatives falling within the spirit and scope of the disclosure.

DETAILED DESCRIPTION

Aspects of the present disclosure relate generally to the field of data storage, and more particularly to memory module data storage. While the present disclosure is not necessarily limited to such applications, various aspects of the disclosure can be appreciated through a discussion of various examples using this context.

Traditional Dual In-line Memory Modules (DIMMs) typically only include volatile memory, such as Dynamic Random Access Memory (DRAM). Non-Volatile Dual In-line Memory Modules (NVDIMMs), on the other hand, include non-volatile memory (e.g., flash memory) coupled to the volatile memory present on the memory module.

DRAM is used as main memory in computers due to its relative low-cost, high-capacity, and high-performance. However, because data storage in DRAM relies on capacitance, the data must be continually refreshed to ensure data integrity by maintaining the appropriate charge in each capacitor. Accordingly, if power is removed from DRAM, the data stored on the DRAM can be erased, as the capacitors will soon lose their charge corresponding to bit storage values.

In contrast, non-volatile memory (e.g., flash memory) maintains data integrity in the absence of a power supply. Technologies such as NAND Flash integrate floating gate transistors to store charge (e.g., and thus data bits) in the absence of a power supply. However, due to the internal circuitry, performance of non-volatile memories can be slower than volatile memories.

NVDIMMs combine the speed of volatile memory with the persistence of non-volatile memory. Some examples of NVDIMMs include NVDIMM-N, NVDIMM-F, and NVDIMM-P. NVDIMM-F is a DIMM module with flash memory. Because NVDIMM-F is a block-based storage, NVDIMM-F can be used for high capacity storage.

NVDIMM-N appears to the host device to operate as a typical DIMM, with the host device only interacting (e.g., reading/writing) with the DRAM on the module. If power is lost, an external power supply (e.g., a battery located on the module) can provide temporary power to the memory module such that the DRAM can be refreshed long enough that it can be backed-up onto a non-volatile memory medium on the module. After power is restored to the NVDIMM-N, the data can be transferred from the non-volatile memory medium back to the DRAM (or other volatile memory).

NVDIMM-P (also referred to as Hybrid DIMM) also includes both volatile and non-volatile memory types. However, as opposed to NVDIMM-N, in NVDIMM-P, both the volatile memory and non-volatile memory are accessible by the host. Accordingly, NVDIMM-P can be more flexible than NVDIMM-N, as data can be accessed from either the non-volatile or volatile memory during operation.

Though in NVDIMM-P both volatile and non-volatile memories are designed to be continuously accessible during operation of the system, persistence is not guaranteed. For example, back up circuit and/or capacitor malfunctioning can occur. Further, there can not be enough time to back up the data stored in the volatile memory to the non-volatile memory before failure occurs. A solution to these issues can include mirroring data writes to the volatile and non-volatile memory. However, this solution is infeasible given the current architecture, as the access times between the volatile and non-volatile memory differ. Accordingly, mirroring is limited to the slowest access time between the volatile and non-volatile memory, which negatively impacts performance (e.g., write speed).

Embodiments of the present disclosure address the aforementioned complications by integrating high speed non-volatile memory (NVM) (e.g., 3DXP memory, fast/low latency NAND, etc.) into the NVDIMM architecture such that writes can be simultaneously mirrored to high speed NVM and volatile memory. By mirroring writes to the high speed NVM and volatile memory, persistence of data in flight is achieved. Further, by including a slow access, but high capacity non-volatile memory chip (e.g., flash), the memory included in the high speed NVM and/or volatile memory can eventually be transferred to the non-volatile memory. Accordingly, persistence can be maintained in the event of a malfunction. Further, the speed and efficiency of the NVDIMM is improved, as writes can be mirrored to both volatile and non-volatile memories simultaneously, rather than having to transfer the memory from the volatile memory to the non-volatile memory, write directly to the non-volatile memory, or limit the write time to the slowest access time (e.g., the non-volatile memory) when mirroring writes.

Figure 1:
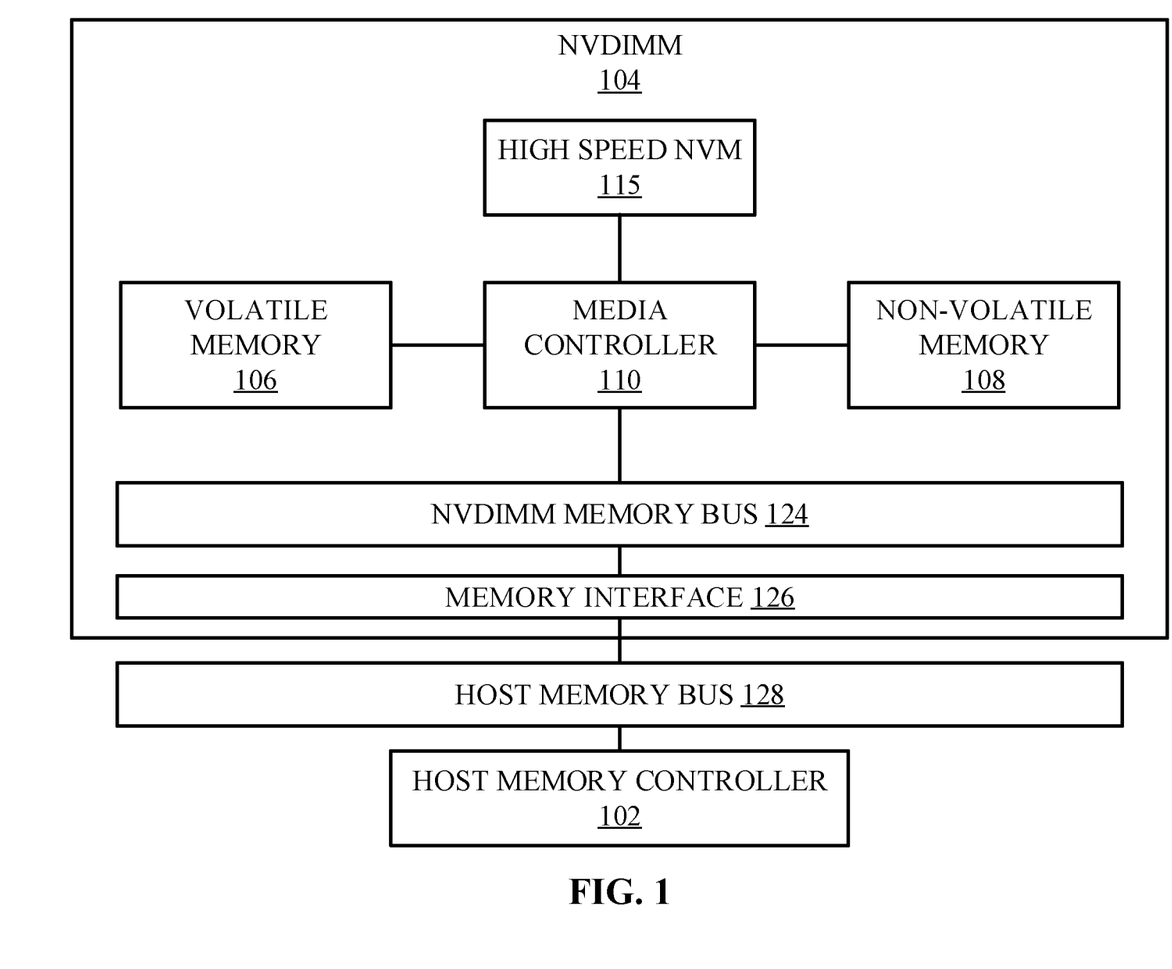
FIG. 1 is a block diagram illustrating an NVDIMM communicatively coupled to a host controller, in accordance with embodiments of the present disclosure.

FIG. 1 depicts a block diagram of a Non-Volatile Dual In-line Memory Module (hereinafter "NVDIMM") 104 communicatively coupled to a host, in accordance with embodiments of the present disclosure. The NVDIMM 104 includes volatile memory 106, non-volatile memory 108, high speed non-volatile memory (NVM) 115, and an NVDIMM media controller 110, which can be communicatively coupled to each other for inter-component communication via an NVDIMM memory bus 124. A host memory controller 102 can be communicatively coupled to the NVDIMM 104 via a host memory bus 128 and a memory interface 126. Generally, the NVDIMM media controller 110, volatile memory 106, non-volatile memory 108, high speed NVM 115, and host memory controller 102 can be communicatively coupled, directly or indirectly, for inter-component communication via the NVDIMM memory bus 124, memory interface 126, and host memory bus 128.

The host memory controller 102 can be configured to issue commands (e.g., writes/reads) to the NVDIMM media controller 110. In some embodiments, the commands issued by the host memory controller 102 can be stored in memory (e.g., a buffer or cache) of the NVDIMM media controller 110, and can be processed therefrom. The host memory controller 102 can issue commands to the NVDIMM media controller 110 to request data from the volatile memory 106, non-volatile memory 108, and/or high speed NVM 115. The NVDIMM media controller 110 can then be configured to provide data associated with the volatile memory 106, non-volatile memory 108, and/or high speed NVM 115 to the host memory controller 102. Accordingly, the host memory controller 102 can be configured to directly access data stored in the volatile memory 106, non-volatile memory 108, and/or high speed NVM 115.

As described herein, the NVDIMM media controller 110, the host memory controller 102, and/or a host processor communicatively coupled to the host memory controller 102 (collectively referred to as "processing circuits") can be configured to complete one or more of the described commands/functions.

In some embodiments, the host memory controller 102 may not be included, and the aforementioned commands and functions issued by the host memory controller 102 can be completed by the NVDIMM media controller 110.

Any number and/or configuration of NVDIMM media controller(s) 110 can be implemented on the NVDIMM 104. In some embodiments, the NVDIMM 104 can include two or more controllers. For example, in embodiments, a first controller can control data flow for the volatile memory 106, a second controller can control data flow for the non-volatile memory 108, and a third controller can control data flow for the high speed NVM 115. In some embodiments, only one controller can be integrated on the NVDIMM 104 (e.g., the NVDIMM media controller 110). In some embodiments, with multi-channel memory architecture, there can be a memory controller corresponding to each memory channel. However, it is noted that any suitable number/configuration of NVDIMM media controller(s) 110 can be implemented on the NVDIMM 104, which can depend on the architecture of the NVDIMM 104. For example, in embodiments where two high speed NVM 115 modules are implemented, each high speed NVM 115 can be communicatively coupled to a corresponding NVDIMM media controller 110.

Further, any number and/or configuration of host memory controllers 102 can be implemented. In some embodiments, the host memory controller 102 is integrated on a host processor. In these embodiments, the host memory controller 102 can control data flow from the host processor to the NVDIMM 104. In some embodiments, the host memory controller 102 can be included on a separate chip. In some embodiments, the host includes two or more host memory controllers 102, and the NVDIMM 104 can be communicatively coupled to multiple hosts, each having its own host memory controller. Any suitable arrangement of integrated and/or stand-alone host memory controllers 102 can be implemented. In some embodiments, no host memory controller 102 can be included.

The type of memory interface 126 can vary. In embodiments, the memory interface can be single data rate (SDR), double data rate (DDR), or quad data rate (QDR). In embodiments where the memory interface is a DDR interface, the DDR interface can be DDR, DDR2, DDR3, DDR4, or DDR5. New generation DDR interfaces (e.g., DDR4/DDR5) provide fast transfer rates due to high frequency memory clocks and/or I/O bus clocks. In some embodiments, the selected DDR is low power double data rate (LPDDR).

In embodiments, the host memory bus 128 can include any suitable bus/interconnect technology. For example, the host memory bus can include a coherent accelerator processor interface (CAPI). CAPI's can directly couple the host memory controller 102 to the NVDIMM 104. The CAPI design provides low latency, high speed, and direct memory access between the memory controllers. In some embodiments however, the host memory bus 128 can include cache coherent interconnect accelerator (CCIX) architecture. In some embodiments, the host memory bus can include Gen-Z Memory Semantic Fabric circuitry.

Volatile memory 106 can include any suitable type of volatile memory (e.g., memory maintained while connected to a power source). For example, volatile memory can be Random Access Memory (RAM) cells. The selected RAM can be Dynamic Random Access Memory, Static Random Access Memory, Extended Data-out RAM (EDO RAM), Synchronous DRAM (SDRAM), and/or Double Data Rate SDRAM (DDR SDRAM), to name a few. The type of RAM can be selected based on the data storage, power, data transfer, and price requirements. For example, DRAM is generally inexpensive compared to SRAM, as DRAM requires one transistor and one capacitor per data bit, whereas typically SRAM requires 6 transistors per data bit. For this reason, DRAM can be used in situations requiring larger data loads in smaller locations (e.g., increased data density). However, SRAM can be advantageous in situations requiring faster data transfer speeds.

Non-volatile memory 108 can include any suitable type of non-volatile memory (e.g., memory maintained without a power supply). For example, the non-volatile memory 108 can include NAND flash memory, NOR flash memory, solid-state storage, Non-Volatile Random Access Memory (NVRAM), hard disk drives, magnetic tape, and/or optical discs. In some embodiments, NAND flash memory can be selected due to its relatively low price, fast read/write/erase times, and long life span (e.g., a high number of erase cycles before memory wear).

The high speed NVM 115 can include any suitable non-volatile memory with rapid access time. For example, high speed NVM 115 can include magnetoresistive random access memory (MRAM), spin-transfer torque magnetic random access memory, (STT-MRAM), 3D XPoint (3DXP) NVM, phase-change memory (PCM), CRAM (chalcogenide RAM), ReRAM, Nano-RAM (RAM integrating carbon nanotubes), etc. The high speed NVM 115 can be selected based on speed requirements. For example, the high speed NVM 115 can be selected such that the access time is substantially similar to the access time of the volatile memory 106 (e.g., DRAM). This allows writes to be mirrored to the volatile memory 106 and high speed NVM 115 simultaneously.

High speed NVM (e.g., 3DXP) is typically more expensive than current NVM technologies (e.g., Flash) per bit. Accordingly, by integrating both high speed NVM 115 and traditional NVM (e.g., NAND/NOR Flash), two advantages are attained. The high speed NVM 115 provides fast access times which allows data writes to be mirrored to the high speed NVM 115 and volatile memory 106 simultaneously, while traditional NVM can be used as an inexpensive storage medium for data at later time (e.g., for eventual persistence).

Any type of NVDIMM media controller 110 can be implemented, which can depend on the architecture of the NVDIMM (e.g., memory channels/types) and actions to be issued. For example, in embodiments with DRAM volatile memory 106, NAND flash non-volatile memory 108, and 3DXP high speed NVM 115, the NVDIMM media controller 110 can be configured to be compatible with each memory type. That is, in these embodiments, the NVDIMM media controller 110 can be configured to read/write to the DRAM, NAND flash, and 3DXP, while refreshing the DRAM as necessary. The NVDIMM media controller 110 can be configured to be compatible with a range of memory mediums. In some embodiments, the NVDIMM media controller 110 can be a Double Data Rate (DDR) (e.g., DDR2, DDR3, DDR4, and DDR5) memory controller, such that data can be transferred on the rising and falling edge of each clock cycle (e.g., twice the data transfer capability without increasing the clock rate). In some embodiments, the NVDIMM media controller 110 can be an entirely hardware controller, while in other embodiments the NVDIMM media controller 110 can include hardware and software (e.g., a microprocessor configured to execute software instructions) components.

The NVDIMM media controller 110 can be configured to issue any number of actions. For example, the NVDIMM media controller 110 can be configured to manage reads/writes (e.g., control the frequency of read/write commands), buffer writes/reads, backup memory (e.g., transfer data from the volatile memory 106 to the non-volatile memory 108, transfer data from the high speed NVM 115 to the NVM 108, etc.), dictate read/write access (e.g., read from volatile memory 106 versus read from non-volatile memory 108), throttle voltage (e.g., reduce or increase voltage to memory mediums), control refresh rate (e.g., increase or decrease refresh rate of DRAM), and/or vary the scrub rate (e.g., alter frequency at which data is inspected and corrected using a redundant copy of the data).

The NVDIMM media controller 110 can be configured to maintain consistency between the volatile memory 106 and the non-volatile memory 108. Currently, data persistence may not be guaranteed in NVDIMM-P systems incorporating DRAM (volatile memory 106) and NAND (non-volatile memory 108). In these systems, data can either be written to the DRAM or the NAND directly by the memory controller (e.g., NVDIMM media controller 110). By writing data to the DRAM and NAND memories separately, failures (e.g., backup circuit malfunctions, capacitor malfunctions, insufficient capacitance, and insufficient write time) can hinder persistence. These issues can be solved by mirroring writes to the DRAM and NAND. However, mirroring writes is not feasible given the difference in access times between the memory types (e.g., DRAM has an access time of ≈100 ns while NAND flash has an access time of ≈100 μs). This limits the write time to the slowest access time between the selected memories (e.g., the write speed is limited by the non-volatile memory access time).

Accordingly, aspects incorporate high speed NVM 115 to maintain persistence between the volatile memory 106 and non-volatile memory 108. For example, in embodiments, data can be mirrored onto the volatile memory 106 and high speed NVM 115 in flight (e.g., in real time during the write). This achieves consistency of data that is in flight. The data from the high speed NVM 115 can then be transferred to the non-volatile memory 108 (e.g., NAND) at a later time, ensuring eventual consistence between the volatile memory 106 and non-volatile memory 108. Accordingly, if a failure occurs at the volatile memory 106, the data can be restored using the data from either the high speed NVM 115 or non-volatile memory 108.

It is noted that FIG. 1 is intended to depict the representative major components of an exemplary NVDIMM 104 coupled to a host. In some embodiments, however, individual components can have greater or lesser complexity than as represented in FIG. 1, components other than or in addition to those shown in FIG. 1 can be present, and the number, type, and configuration of such components can vary. For example, in some embodiments, the NVDIMM 104 can include two or more high speed NVM 115 chips. Similarly, two or more volatile memory 106 and/or non-volatile memory 108 chips can be included.

Figure 2:
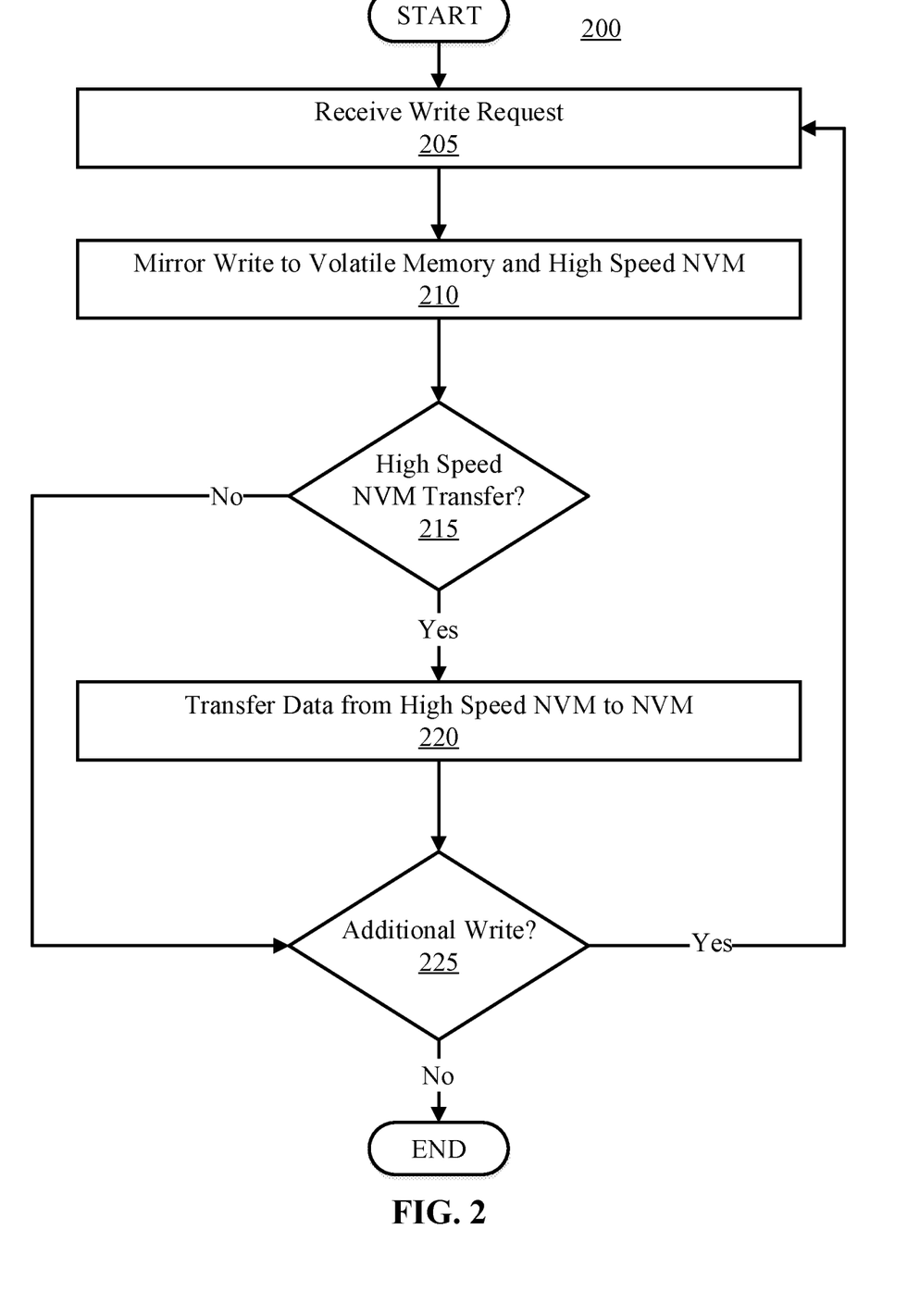
FIG. 2 is a flow-diagram illustrating a process for mirroring writes to a high speed NVM and a volatile memory, in accordance with embodiments of the present disclosure.

Referring now to FIG. 2, shown is a flow-diagram illustrating an example process 200 for maintaining persistence on an NVDIMM (e.g., NVDIMM 104), in accordance with embodiments of the present disclosure.

The process 200 initiates where a write request is received. This is illustrated at step 205. The write request can be received from a host memory controller (e.g., host memory controller 102) or a host processor at an NVDIMM media controller (e.g., NVDIMM media controller 110). The write request is then mirrored to the volatile memory (e.g., volatile memory 106) and high speed non-volatile memory (high speed NVM 115). This is illustrated at step 210. The high speed NVM and volatile memory can have similar access times, allowing writes to be mirrored while data is in flight. By mirroring writes, consistency is provided while data is being written. Accordingly, in the event of a failure, the high speed NVM can be used to restore the data to the volatile memory when power is restored.

A determination is then made whether to transfer the high speed NVM to non-volatile memory (e.g., non-volatile memory 108). This is illustrated at step 215. Determining whether to transfer the high speed NVM to non-volatile memory can be completed in any suitable manner. In some embodiments, the determination can be completed based on whether an I/O (e.g., a read or write) is currently issued. If no I/O's are issued, then the system can automatically transfer the memory from the high speed NVM to the non-volatile memory. In some embodiments, determining whether to transfer memory from the high speed NVM to the non-volatile memory can be based on whether there is currently a read I/O command. If there is a read I/O command, no data is currently being written, and a determination can be made to transfer the high speed NVM to the non-volatile memory.

In some embodiments, the determination can be completed based on an amount of currently occupied memory in the high speed NVM (e.g., based on an occupied percentage of the total capacity, a number of bits stored, the rate at which data is being written, etc.). In these embodiments, a threshold (e.g., based on percentage of occupied memory, a number of bits, the rate at which data is being written, etc.) can be implemented to determine when to transfer the high speed NVM to the non-volatile memory. For example, if a high speed NVM transfer threshold is set to 1 gigabyte (GB) of memory, if the amount of memory stored in the high speed NVM exceeds 1 GB, the memory in the high speed NVM can be transferred to the non-volatile memory.

In some embodiments, the high speed NVM can be transferred periodically (based on a predetermined time interval (e.g., every 10 seconds, minute minutes)). In some embodiments, the determination to transfer the high speed NVM to the non-volatile memory is completed based on a user initiated command (e.g., the user specifies, on a graphical user interface (GUI), to transfer the data included in the high speed NVM to the non-volatile memory).

In some embodiments, the determination to transfer the high speed NVM can be completed based on power conditions. For example, the high speed NVM can be transferred based on thermal/power sensor data on the NVDIMM. In embodiments, the high speed NVM data can be dispatched to the non-volatile memory based on the temperature of the NVDIMM (e.g., in response to the temperature on the NVMDIMM reaching a particular temperature threshold, the high speed NVM can be transferred to the non-volatile memory). In embodiments, the high speed NVM data can be dispatched to the non-volatile memory based on the voltage level of the NVDIMM (e.g., in response to the voltage on the NVMDIMM reaching a particular voltage threshold, the high speed NVM can be transferred to the non-volatile memory). The power state (e.g., temperature and/or voltage) of the NVDIMM can indicate whether back-up precautions are necessary. Accordingly, using temperature and/or voltage sensor data to dictate high speed NVM transfers can be beneficial for providing data persistence.

If a determination is made that the high speed NVM is to be flushed to the non-volatile memory, the data in the high speed NVM is transferred to the non-volatile memory. This is illustrated at step 220. In embodiments, the NVDIMM media controller copies the data (e.g., a read/write command) from the high speed NVM to the non-volatile memory, and erases (e.g., flushes) the data in the high speed NVM after the copy is complete.

If a determination is made to not transfer the high speed NVM to the non-volatile memory at step 215, or if the data is transferred from the high speed NVM to the non-volatile memory at step 220, a determination is made whether there is an additional write. This is illustrated at step 225. If there is an additional write, the write request is received at step 205. If there is no additional write, then process 200 ends. By mirroring writes to the high speed NVM and volatile memory simultaneously, persistence of data in flight is achieved. Further, by transferring the data from the high speed NVM to the non-volatile memory, eventual persistence of data is achieved.

Figure 3:
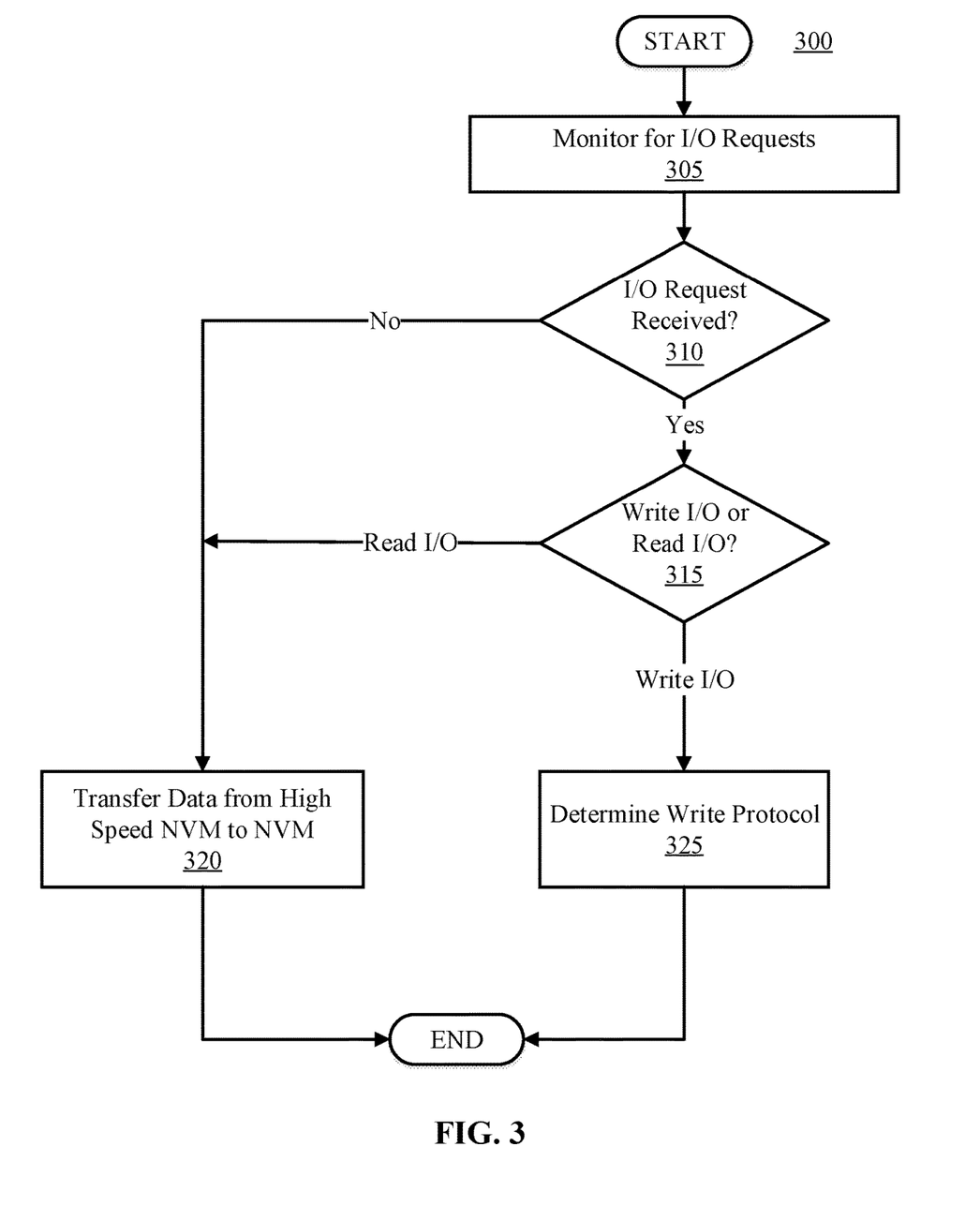
FIG. 3 is a flow-diagram illustrating a process for determining whether to transfer data included in a high speed NVM to a non-volatile memory, in accordance with embodiments of the present disclosure.

Referring now to FIG. 3, shown is a flow-diagram illustrating a process 300 for monitoring I/O requests to determine whether data should be transferred from a high speed non-volatile memory (e.g., high speed NVM 115) to a non-volatile memory (e.g., non-volatile memory 108) on an NVDIMM (e.g., NVDIMM 104), in accordance with embodiments of the present disclosure.

Process 300 initiates where the NVDIMM is monitored for I/O requests. This is illustrated at step 305. In embodiments, a memory controller (e.g., NVDIMM media controller 110) located on the NVDIMM monitors for I/O requests. In embodiments, a host controller (e.g., host memory controller 102) coupled to a central processing unit (CPU) monitors for I/O requests. A determination is whether an I/O request is received based on the monitoring. This is illustrated at step 310. If no I/O requests are received, data is transferred from the high speed NVM to the non-volatile memory. This is illustrated at step 320. Because there are no I/O requests at step 320, there is no data currently being written to any memory chips (e.g., the VM, high speed NVM, or NVM) located on the NVDIMM. When no data is currently in flight, transferring the data from the high speed NVM to the non-volatile memory can be sought to free up memory on the high speed NVM.

If an I/O request is received, then a determination is made whether the I/O request is a write I/O or a read I/O. This is illustrated at step 315. If a read I/O is received, then the data from the high speed NVM is transferred to the non-volatile memory, as no data is currently in flight. This is illustrated at step 320. If the I/O request is a write, then write locations within the NVDIMM are determined. This is illustrated at step 325.

Determining the write protocol at step 325 can include determining whether the data should be written to one or more of the volatile memory, non-volatile memory, or high speed NVM. In some embodiments, the write protocol can include writing solely to the volatile memory. In some embodiments, the write protocol can include writing to the volatile memory and high speed NVM simultaneously (e.g., mirroring writes). In some embodiments, the write protocol can include writing solely to the non-volatile memory. However, the write protocol at step 325 can vary. For example, in some embodiments, the write protocol can include writing solely to the high speed NVM.

In some embodiments, the write protocol can be determined based on the thermal/power state of the NVDIMM. For example, if thermal/voltage data indicate that the NVDIMM will soon be taken offline (e.g., due to overheating or a power surge), the write protocol can include transferring (e.g., saving, copying, etc.) the data to a persistent memory (e.g., either the high speed NVM or non-volatile memory). In these embodiments, sensors associated with thermal/power conditions (e.g., temperature and/or voltage sensors) can be used to dictate write location. For example, in response to exceeding a temperature threshold on one or more thermal sensors, data can be written to a non-volatile memory. Similarly, in response to voltage exceeding a voltage sensor on the NVDIMM, data can be written to non-volatile memory.

In embodiments, determining the write protocol can be completed by decoding write bits of an NVDIMM write command. Shown below is a table indicating write bits and locations of an NVDIMM-P write command.

TABLE 1

| | BITS | | | | | | | |
|---|---|---|---|---|---|---|---|---|
| C0-C2 | BG0-BG1 | BA0-BA1 | A17 | A12/BC_n | A13 | A11 | A10/AP | A0-A9 |
| WRITE | ADDR [39:33] | | | WID [7:5] | | RFU | Persistent | ADDR [32:23] |

As illustrated in Table 1, write bits of an NVDIMM write command can dictate the location for the data of the write. The write bits can be decoded to determine a write protocol (e.g., a write location). In some embodiments, a host processor can decode the write bits upon issuing a write command to determine an appropriate write location. The write location can then be dispatched to the NVDIMM media controller, such that the memory of the write command can be stored to the proper write location. For example, decoding bits C0-C2, BG0-BG1, or BA0-BA1 leads to the data of the write command being written to address [39:33]. Similarly, decoding bits A0-A9 leads to the data of the write command being written to address [32:23].

In embodiments, determining whether the write is to be written to the high speed NVM, volatile memory and/or non-volatile memory (e.g., determining the write protocol) can be based on decoding the A11 and A10 bits. The A11 and A10 bits dictate whether the data is indicated to be reserved for future use (RFU) and/or indicated to be persistent. Shown below is a table indicating write locations based on the binary state of the A11 and A10 write bits.

TABLE 2

| A11 | A10 | Write Location |
|---|---|---|
| 0 | 0 | Volatile Memory (VM) |
| 0 | 1 | Non-Volatile Memory |
| 1 | 0 | Fast NVM |
| 1 | 1 | VM and Fast NVM |

As depicted in Table 2, if the A11 and A10 bits both have a binary state of 0, a determination can be made to write the data of the write command to volatile memory (e.g., volatile memory 106). If the binary state of the A11 write bit is 0 and the binary state of the A10 write bit is 1, the data of the write command can be written to the non-volatile memory (e.g., non-volatile memory 108). If the binary state of the A11 write bit is 1 and the binary state of the A10 bit is 0, then the data of the write command can be written to the high speed NVM (e.g., high speed NVM 115). If the binary state of the A11 and A10 bits are each 1, then the data of the write command can be mirrored to both the volatile memory and high speed NVM. After the appropriate write locations are determined at step 325, or after data is transferred from the high speed NVM to the non-volatile memory at step 320, process 300 ends.

Figure 4:
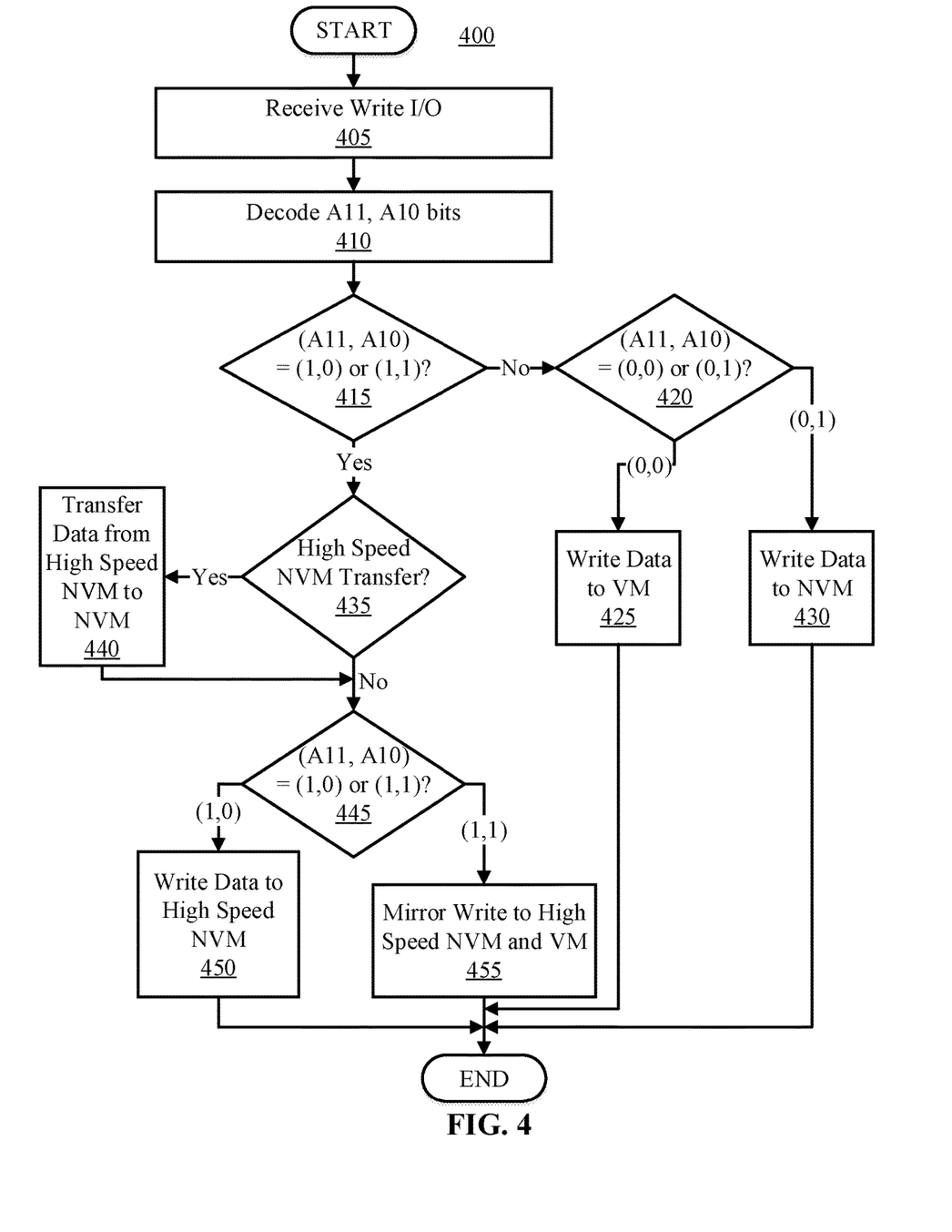
FIG. 4 is a flow-diagram illustrating a process for determining one or more write locations for data on an NVDIMM based on decoding bits of an NVDIMM write command, in accordance with embodiments of the present disclosure.

Referring now to FIG. 4, shown is a flow-diagram illustrating a process 400 for determining write locations based on decoding bits of an NVDIMM write command, in accordance with embodiments of the present disclosure. The write locations can be determined by decoding the A11 and A10 bits of the NVDIMM write command, as seen in Table 2 above.

Process 400 initiates at step 405, where a write I/O is received. This is illustrated at step 405. The write I/O can be the same as, or substantially similar to, the WRITE command shown in Table 1. After the write I/O is received, the A11 and A10 bits are decoded to determine their binary state. This is illustrated at step 410. The binary states of the A11 and A10 bits can dictate the proper write location similar to as shown in Table 2.

A determination is then made whether the (A11, A10) bits have the binary state (1, 0) or (1, 1). This is illustrated at step 415. The determination can be made based on decoding and reading the A11 and A10 bits. In embodiments, the determination (e.g., decoding and reading the (A11, A10 bits) can be completed by a host processor, a host memory controller and/or the NVDIMM media controller (e.g., one or more processing circuits). If the (A11, A10) bits do not have the binary state (1, 0) or (1, 1) (e.g., the binary state is either (0, 0) or (0, 1)), then a determination is made whether the binary state of the (A11, A10) bits is (0, 0) or (0, 1). This is illustrated at step 420.

If the binary state of the (A11, A10) bits is (0, 0), then the data of the write command is written solely to the volatile memory (e.g., volatile memory 106). This is illustrated at step 425. If the binary state of the (A11, A10) bits is (0, 1), then the data of the write command is written solely to the non-volatile memory (e.g., non-volatile memory 108). This is illustrated at step 430.

If a determination is made that the (A11, A10) bits are either (1, 0) or (1, 1), then a determination is made whether a high speed NVM transfer (e.g., a transfer of the memory in the high speed NVM 115 to the non-volatile memory 108) is required. This is illustrated at step 435. Because the A11 bit indicates whether the data of the write command will be written to the high speed NVM, if the A11 bit is decoded to 1, (e.g., (A11, A10) is either (1, 0) or (1, 1)), a determination is made whether a high speed NVM transfer is required at step 435. This is completed to free up memory in the high speed NVM prior to the write (if necessary). In embodiments, determining whether a high speed NVM transfer is required is completed in a manner similar to step 215 of FIG. 2 (e.g., based on a threshold of memory occupied, based on thermal/voltage sensor data, based on the rate at which data is being written to the high speed NVM). In some embodiments, a high speed NVM transfer is determined if the amount of memory to be written with the NVDIMM write command exceeds the total available memory in the high speed NVM.

If a determination is made that a high speed NVM transfer is required, the data in the high speed NVM is transferred to the non-volatile memory. This is illustrated at step 440. After the memory is transferred from the high speed NVM to the non-volatile memory at step 440, or if a determination is made that a high speed NVM transfer is not required at step 435, a determination is made whether the (A11, A10) bits are (1, 0) or (1, 1). This is illustrated at step 445. If a determination is made that the (A11, A10) bits are (1, 0), then the data of the write command is written to the high speed NVM. This is illustrated at step 450. If a determination is made that the (A11, A10) bits are (1, 1), then the data of the write command is mirrored to the High speed NVM and volatile memory simultaneously. This is illustrated at step 455. After the write protocol is complete (e.g., data is written at step 425, 430, 450, or 455), then process 400 ends. Additional I/O's can then be monitored.

In some embodiments, multiple high speed NVM modules (e.g., chips) can be implemented on the NVDIMM. In these instances, determinations can be made as to which high speed NVM modules to write to, as well as which high speed NVM modules to transfer and flush. For example, if a first high speed NVM module is at capacity (e.g., exceeds a memory storage threshold), but a second high speed NVM module is not at capacity (e.g., falls below a memory storage threshold), a determination at step 440 can include transferring (e.g., to the non-volatile memory) and flushing the data of the first high speed NVM module only. Similarly, when determining whether to write to the first high speed NVM module or the second high speed NVM module, the amount of data stored on each high speed NVM module can be considered. For example, if the second high speed NVM module is storing less data than the first high speed NVM module, the write command at either steps 450 or 455 can include writing only to the second high speed NVM module.

Determining whether to transfer/flush any particular high speed NVM module can be completed the same as, or substantially similar to, as described in step 215 of FIG. 2, step 320 of FIG. 3, or step 435 of FIG. 4. Issuing high speed NVM transfers can be completed based on power data (e.g., thermal/voltage sensors), I/O monitoring (e.g., whether an I/O is issued or whether an I/O is a read/write), data storage thresholds (e.g., current amount stored, the rate at which data is being written, available vs. required, etc.), and the like.

In some embodiments including multiple high speed NVM modules, data writes can be performed until each high speed NVM module is full (e.g., at capacity or exceeding a memory threshold). Afterwards, a determination can be made to transfer the data of each high speed NVM module to a non-volatile memory. Alternatively, in embodiments including multiple high speed NVM modules, upon exceeding a memory threshold in any single high speed NVM, the respective high speed NVM module data can be transferred and flushed prior to reaching capacity collectively between the multiple high speed NVM modules.

In some embodiments, high speed NVM modules can be mapped to particular non-volatile memories. For example, high speed NVM modules can be mapped 1-to-1 to non-volatile memory chips. In this example, if a first high speed NVM module corresponding to a first non-volatile memory is at capacity, the first high speed NVM can be transferred to the first non-volatile memory. Similarly, if a second high speed NVM module corresponding to a second non-volatile memory is at capacity, the second high speed NVM can be transferred to the second non-volatile memory.

In some embodiments, multiple high speed NVM modules can be mapped to a single non-volatile memory (e.g., 2-to-1, 3-to-1, 10-to-1, etc.). In these embodiments, particular address ranges of the non-volatile memory can correspond to particular high speed NVM modules. For example, in a system where three high speed NVM modules are mapped to a single non-volatile memory, the non-volatile memory can be partitioned into three address subsets, each address subset mapping to a particular high speed NVM. This scheme can be completed for any suitable mapping (E.g., 3-to-2, 5-to-3, etc.).

Reference will now be made to an example NVDIMM having a single volatile memory module (having a 4 GB capacity), three high speed NVM modules (e.g., each having a 2 GB capacity), and two non-volatile memory modules (e.g., each having a 3 GB capacity). In this example, a first high speed NVM can be mapped to a 2 GB partition of a first non-volatile memory, a second high speed NVM can be mapped to the remaining 1 GB partition of the first non-volatile memory and a 1 GB partition of a second non-volatile memory, and a third high speed NVM can be mapped to the remaining 2 GB partition of the second non-volatile memory.

In this example, the data stored in the high speed NVM's can be flushed to a corresponding non-volatile memory partition in any suitable manner. For example, the first high speed NVM can be transferred to the first non-volatile memory in response to a thermal/voltage sensor exceeding a threshold value. The second high speed NVM can be transferred to the first and/or second non-volatile memory based on I/O indications (e.g., if there is no currently issued I/O or if a read I/O is detected). The third high speed NVM can be transferred in response to a memory value exceeding a memory threshold (e.g., the third high speed NVM exceeds 1.5 GB of data stored). However, it is to be noted that any suitable transfer trigger can be executed.

Further, determining which high speed NVM to write to can be completed in any manner. For example, determining a high speed NVM write location out of multiple high speed NVM write locations can be completed based on occupied memory (e.g., the high speed NVM with the most available space), power conditions (e.g., the high speed NVM with the lowest temperature/voltage), etc. Following the example above, if the first high speed NVM is storing 1 GB, the second high speed NVM is storing 0.5 GB, and the third high speed NVM is storing 1.5 GB, and a write request to be stored in a high speed NVM is received, a determination can be made to write the data of the write request to the second high speed NVM, as it has the most free space. Similarly, if thermal data associated with sensors on each high speed NVM indicates that the first high speed NVM is overheating (e.g., exceeding a threshold), the second high speed NVM is overheating, and the third high speed NVM is within an acceptable temperature range (e.g., satisfies a threshold), then a determination can be made to write to the third high speed NVM, as the temperature is within a specified range or below a threshold.

Figure 5:
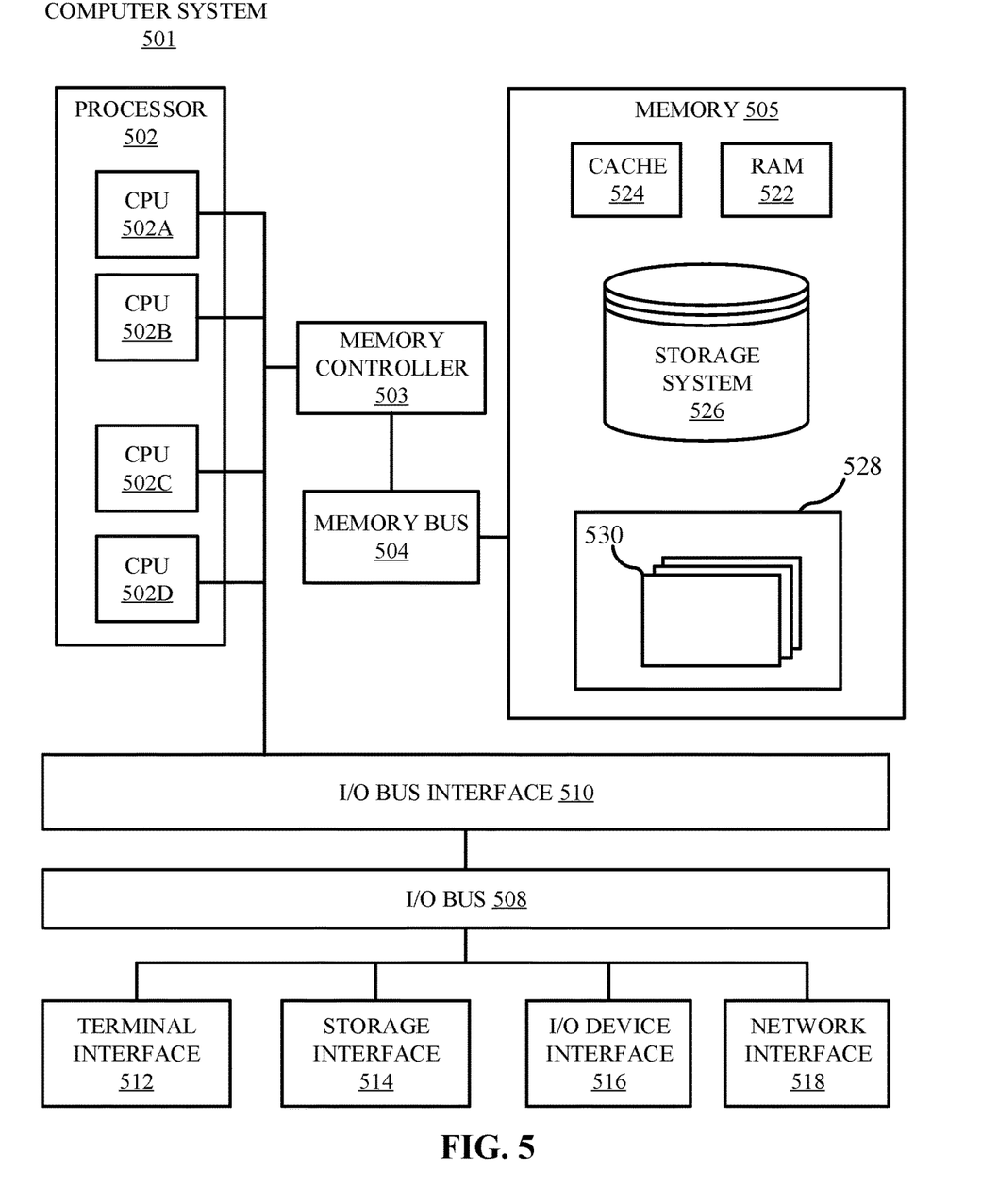
FIG. 5 depicts a high-level block diagram of an example computer system that can be used in implementing one or more of the methods, tools, and modules, and any related functions described herein (e.g., using one or more processor circuits or computer processors of the computer), in accordance with embodiments of the present disclosure.

Referring now to FIG. 5, shown is a high-level block diagram of an example computer system 501 (e.g., a host device including an NVDIMM) that can be used in implementing one or more of the methods, tools, and modules, and any related functions, described herein (e.g., using one or more processor circuits or computer processors of the computer), in accordance with embodiments of the present disclosure. In some embodiments, the major components of the computer system 501 can comprise one or more CPUs 502, a memory subsystem 505, a terminal interface 512, a storage interface 514, an I/O (Input/Output) device interface 516, and a network interface 518, all of which can be communicatively coupled, directly or indirectly, for inter-component communication via a memory bus 504, an I/O bus 508, and an I/O bus interface unit 510.

The computer system 501 can contain one or more general-purpose programmable central processing units (CPUs) 502A, 502B, 502C, and 502D, herein generically referred to as the CPU 502. In some embodiments, the computer system 501 can contain multiple processors typical of a relatively large system; however, in other embodiments the computer system 501 can alternatively be a single CPU system. Each CPU 502 can execute instructions stored in the memory subsystem 505 and can include one or more levels of on-board cache. The control of data flow from the processor 502 to the memory subsystem 505 can be facilitated by memory controller 503. The memory controller 503 can be configured to direct data to appropriate locations (e.g., addresses) within the memory subsystem 505. The processor 502 can be substantially the same as the host processor previously described. The memory controller 503 can be substantially the same as the host memory controller 102 and/or NVDIMM media controller 110 previously described.

System memory 505 can include computer system readable media in the form of volatile memory, such as random access memory (RAM) 522 or cache memory 524. Computer system 501 can further include other removable/non-removable, volatile/non-volatile computer system storage media (e.g., high speed NVM such as 3DXP NVM, ReRAM, NRAM, etc. or non-volatile memory such as NAND flash, NOR flash, solid state drive, or hard disk drive memories). By way of example only, storage system 526 can be provided for reading from and writing to a non-removable, non-volatile magnetic media, such as a "hard drive." Although not shown, a magnetic disk drive for reading from and writing to a removable, non-volatile magnetic disk (e.g., a "floppy disk"), or an optical disk drive for reading from or writing to a removable, non-volatile optical disc such as a CD-ROM, DVD-ROM or other optical media can be provided. In addition, memory 505 can include flash memory (e.g., a flash memory stick drive or a flash drive). Memory devices can be connected to memory bus 504 by one or more data media interfaces. For example, the NVDIMM (e.g., NVDIMM 104) depicted in FIG. 1 can be connected to the memory bus 504 via a memory interface (e.g., memory interface 126 as depicted in FIG. 1). The NVDIMM can be included in the storage system 526. The memory 505 can include at least one program product having a set (e.g., at least one) of program modules that are configured to carry out the functions of various embodiments.

Further, one or more memory modules can be included in the storage system 526. For example, an NVDIMM (e.g., NVDIMM 104) can be included in the storage system 526. The one or more memory modules can include their own memory controllers (e.g., NVDIMM media controller 110), processors, sensors, buses (e.g., NVDIMM memory bus 124), and any other suitable memory module components.

It is noted that FIG. 5 is intended to depict the representative major components of an exemplary computer system 501. In some embodiments, however, individual components can have greater or lesser complexity than as represented in FIG. 5, components other than or in addition to those shown in FIG. 5 can be present, and the number, type, and configuration of such components can vary.

One or more programs/utilities 528, each having at least one set of program modules 530 can be stored in memory 504. The programs/utilities 528 can include a hypervisor (also referred to as a virtual machine monitor), one or more operating systems, one or more application programs, other program modules, user interfaces, and program data. Each of the operating systems, one or more application programs, other program modules, and program data or some combination thereof, can include an implementation of a networking environment. Program modules 530 generally perform the functions or methodologies of various embodiments.

For example, in an embodiment of the present disclosure, the program modules 530 of the memory 505 can include an NVDIMM management module. The NVDIMM management module can include computer instructions to perform one or more of the aforementioned operations. For example, the NVDIMM management module can include computer instructions to monitor I/O's, determine whether an I/O write occurs, decode bits of the I/O write command, determine one or more locations for writes, and/or determine whether a high speed NVM transfer operation is to be executed.

The computer system 501 can interface a variety of peripheral devices, storage devices, and networks through the terminal interface 512, storage interface 514, I/O device interface 516, and network interface 518. In some embodiments, the storage interface 514 can be substantially the same as the memory interface as depicted in FIG. 1 (e.g., memory interface 126). The storage interface 514 can allow the NVDIMM to be communicatively coupled to the computer system 501.

Although the memory bus 504 is shown in FIG. 5 as a single bus structure providing a direct communication path among the CPUs 502, the memory subsystem 505, and the I/O bus interface 510, the memory bus 504 can, in some embodiments, include multiple different buses or communication paths, which can be arranged in any of various forms, such as point-to-point links in hierarchical, star or web configurations, multiple hierarchical buses, parallel and redundant paths, or any other appropriate type of configuration. Furthermore, while the I/O bus interface 510 and the I/O bus 508 are shown as single respective units, the computer system 501 can, in some embodiments, contain multiple I/O bus interface units 510, multiple I/O buses 508, or both. Further, while multiple I/O interface units are shown, which separate the I/O bus 508 from various communications paths running to the various I/O devices, in other embodiments some or all of the I/O devices can be connected directly to one or more system I/O buses.

In some embodiments, the computer system 501 can be a multi-user mainframe computer system, a single-user system, or a server computer or similar device that has little or no direct user interface, but receives requests from other computer systems (clients). Further, in some embodiments, the computer system 501 can be implemented as a desktop computer, portable computer, laptop or notebook computer, tablet computer, pocket computer, telephone, smart phone, network switches or routers, or any other appropriate type of electronic device.

As discussed in more detail herein, it is contemplated that some or all of the operations of some of the embodiments of methods described herein can be performed in alternative orders or may not be performed at all; furthermore, multiple operations may occur at the same time or as an internal part of a larger process.

The present disclosure may be a system, a method, and/or a computer program product. The computer program product may include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers, and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the various embodiments. As used herein, the singular forms "a," "an," and "the" are intended to include the plural forms as well, unless the context clearly indicates otherwise. It will be further understood that the terms "includes" and/or "including," when used in this specification, specify the presence of the stated features, integers, steps, operations, elements, and/or components, but do not preclude the presence or addition of one or more other features, integers, steps, operations, elements, components, and/or groups thereof. In the previous detailed description of example embodiments of the various embodiments, reference was made to the accompanying drawings (where like numbers represent like elements), which form a part hereof, and in which is shown by way of illustration specific example embodiments in which the various embodiments may be practiced. These embodiments were described in sufficient detail to enable those skilled in the art to practice the embodiments, but other embodiments may be used and logical, mechanical, electrical, and other changes may be made without departing from the scope of the various embodiments. In the previous description, numerous specific details were set forth to provide a thorough understanding the various embodiments. But, the various embodiments may be practiced without these specific details. In other instances, well-known circuits, structures, and techniques have not been shown in detail in order not to obscure embodiments.

Different instances of the word "embodiment" as used within this specification do not necessarily refer to the same embodiment, but they may. Any data and data structures illustrated or described herein are examples only, and in other embodiments, different amounts of data, types of data, fields, numbers and types of fields, field names, numbers and types of rows, records, entries, or organizations of data may be used. In addition, any data may be combined with logic, so that a separate data structure may not be necessary. The previous detailed description is, therefore, not to be taken in a limiting sense.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Although the present disclosure has been described in terms of specific embodiments, it is anticipated that alterations and modification thereof will become apparent to the skilled in the art. Therefore, it is intended that the following claims be interpreted as covering all such alterations and modifications as fall within the true spirit and scope of the disclosure.

What is claimed is:

1. A system comprising:
   a non-volatile dual in-line memory module including a volatile memory, a high speed non-volatile memory (high speed NVM), and a non-volatile memory; and
   one or more processing circuits, wherein the one or more processing circuits are configured to perform a method comprising:
   receiving an I/O request;
   determining whether the I/O request is a write or a read;
   in response to determining that the I/O request is a read, transferring data included in the high speed non-volatile memory to the non-volatile memory;
   in response to determining that the I/O request is a write,
   determining at least one location to write data of the write based on decoding bits of the write; and
   writing, based on the decoded bits, the data of the write to the at least one location.

2. The system of claim 1, wherein the I/O request is the write, wherein determining at least one location to write data of the write based on decoding bits of the write and writing the data of the write to the at least one location comprises:
   determining, based on the decoded bits, that the data of the write should be written to the volatile memory and high speed NVM simultaneously; and
   writing the data of the write to the volatile memory and high speed NVM simultaneously.

3. The system of claim 1, wherein the at least one location to write the data of the write is the high speed NVM, wherein prior to writing the data to the high speed NVM, the one or more processing circuits are configured to:
   determine whether data of the high speed NVM is to be transferred to the non-volatile memory;
   copy, in response to determining that the data of the high speed NVM is to be transferred to the non-volatile memory, the data of the high speed NVM from the high speed NVM to the non-volatile memory; and
   erase, in response to copying the data to the non-volatile memory, the data from the high speed NVM.

4. The system of claim 3, wherein the determining whether the data of the high speed NVM is to be transferred to the non-volatile memory includes:
   determining an amount of memory occupied in the high speed NVM;
   comparing the amount of memory to a memory threshold; and
   determining, in response to the amount of memory exceeding the memory threshold, that the data is to be transferred from the high speed NVM to the non-volatile memory.

5. The system of claim 3, wherein the determining whether the data of the high speed NVM is to be transferred to the non-volatile memory includes:
   determining, by referencing one or more temperature sensors on the memory module, a temperature of the memory module;
   comparing the temperature of the memory module to a temperature threshold; and
   determining, in response to the temperature of the memory module exceeding the temperature threshold, that the data is to be transferred from the high speed NVM to the non-volatile memory.

6. The system of claim 1, wherein the I/O request is the write, wherein determining at least one location to write data of the write based on decoding bits within the write and writing the data of the write to the at least one location comprises:
   determining, based on the decoded bits, that the data of the write should be written to high speed NVM;
   determining whether data of the high speed NVM is to be transferred to the non-volatile memory;
   copying, in response to determining that the data of the high speed NVM is to be transferred to the non-volatile memory, the data of the high speed NVM from the high speed NVM to the non-volatile memory;
   erasing, in response to copying the data to the non-volatile memory, the data from the high speed NVM; and
   writing the data of the write to the volatile memory and high speed non-volatile memory simultaneously.

7. The system of claim 1, wherein the volatile memory is dynamic random access memory (DRAM), wherein the high speed NVM is 3D XPoint memory, wherein the non-volatile memory is flash memory.

8. A method for maintaining persistence on a non-volatile dual in-line memory module, the memory module including at least one volatile memory, at least one high speed non-volatile memory (NVM) and at least one non-volatile memory, the method comprising:
receiving a write request;
decoding bits of the write request;
determining, based on the decoded bits, that data of the write request should be mirrored to the at least one high speed NVM and the at least one volatile memory simultaneously;
determining, in response to determining that the data of the write request should be mirrored to the at least one high speed NVM and the at least one volatile memory simultaneously, that data of the at least one high speed NVM should be transferred to the at least one non-volatile memory and flushed;
transferring, in response to determining that the data of the at least one high speed NVM should be transferred to the non-volatile memory, data from the at least one high speed NVM to the at least one non-volatile memory;
flushing, in response to transferring the data of the at least one high speed NVM to the at least one non-volatile memory, the data from the at least one high speed NVM; and
writing, in response to flushing the data from the at least one high speed NVM, the data of the write request to the at least one high speed NVM and the at least one volatile memory simultaneously.

9. The method of claim 8, wherein the non-volatile dual in-line memory module includes two high speed NVM's, wherein prior to writing, a determination is made which of the two high speed NVM's to write data of the write request to, the determination comprising:
determining a first amount of memory stored in a first high speed NVM of the two high speed NVM's;
determining a second amount of memory stored in a second high speed NVM of the two high speed NVM's;
comparing the first amount of memory stored in the first high speed NVM with the second amount of memory stored in the second high speed NVM; and
determining, in response to the first amount of memory stored in the first high speed NVM being less than the second amount of memory stored in the second high speed NVM, that the data of the write request should be written to the first high speed NVM and not the second high speed NVM, where writing includes writing data of the write request to the first high speed NVM and the at least one volatile memory simultaneously.

10. The method of claim 8, wherein the non-volatile dual in-line memory module includes two high speed NVM's, wherein prior to writing, a determination is made which of the two high speed NVM's to write data of the write request to, the determination comprising:
determining a first amount of memory stored in a first high speed NVM of the two high speed NVM's;
determining a second amount of memory stored in a second high speed NVM of the two high speed NVM's;
comparing the first amount of memory stored in the first high speed NVM to a memory threshold;
comparing the second amount of memory stored in the second high speed NVM to the memory threshold;
determining, based on the comparisons, that the first amount of memory stored in the first high speed NVM satisfies the memory threshold and that the second amount of memory stored in the second high speed NVM exceeds the memory threshold; and
determining, in response to the first amount of memory stored in the first high speed NVM satisfying the memory threshold and the second amount of memory stored in the second high speed NVM exceeding the memory, that the data of the write request should be written to the first high speed NVM and not the second high speed NVM, where writing includes writing data of the write request to the first high speed NVM and the at least one volatile memory simultaneously.

11. The method of claim 8, wherein the non-volatile dual in-line memory module includes two high speed NVM's, wherein determining that data of the at least one high speed NVM should be transferred to the at least one non-volatile memory and flushed comprises:
determining a first amount of memory stored in a first high speed NVM of the two high speed NVM's;
determining a second amount of memory stored in a second high speed NVM of the two high speed NVM's;
comparing the first amount of memory stored in the first high speed NVM with the second amount of memory stored in the second high speed NVM; and
determining, based on the first amount of memory stored in the first high speed NVM being higher than the second amount of memory stored in the second high speed NVM, that the first amount of memory stored in the first high speed NVM should be transferred to the at least one non-volatile memory and flushed and that the second amount of memory stored in the second high speed NVM should not be transferred to the at least one non-volatile memory.

12. The method of claim 8, wherein determining that the data of the high speed NVM should be transferred to the non-volatile memory and flushed includes:
determining, by referencing one or more voltage sensors on the memory module, a voltage of the memory module;
comparing the voltage of the memory module to a voltage threshold; and
determining, in response to the voltage of the memory module exceeding the voltage threshold, that the data of the at least one high speed NVM is to be transferred from the high speed NVM to the non-volatile memory.

13. The method of claim 8, further comprising:
receiving a second write request;
decoding bits of the second write request;
determining, based on the decoded bits of the second write request, that data of the second write request should be written to the at least one high speed NVM only; and
writing the data of the second write request to the at least on high speed NVM.

14. The method of claim 8, further comprising:
monitoring for an I/O request;
determining whether the I/O request is a write request or a read request; and
transferring, in response to determining that the I/O request is the read request, data of the at least one high speed NVM to the at least one non-volatile memory.

15. A computer program product comprising a computer readable storage medium having program instructions embodied therewith, the program instructions executable by a processor to cause the processor to perform a method for maintaining persistence on a non-volatile dual in-line memory module, the memory module including at least one volatile memory, at least one high speed non-volatile memory (NVM) and at least one non-volatile memory, the method comprising:
receiving a write request;
decoding bits of the write request;
determining, based on the decoded bits, that data of the write request should be mirrored to the at least one high speed NVM and the at least one volatile memory simultaneously;
determining, in response to determining that the data of the write request should be mirrored to the at least one high speed NVM and the at least one volatile memory simultaneously, that data of the at least one high speed NVM should be transferred to the at least one non-volatile memory and flushed;
transferring, in response to determining that the data of the at least one high speed NVM should be transferred to the non-volatile memory, data from the at least one high speed NVM to the at least one non-volatile memory;
flushing, in response to transferring the data of the at least one high speed NVM to the at least one non-volatile memory, the data from the at least one high speed NVM; and
writing, in response to flushing the data from the at least one high speed NVM, the data of the write request to the at least one high speed NVM and the at least one volatile memory simultaneously.

16. The computer program product of claim 15, wherein the method performed by the processor further comprises:
receiving a second write request;
decoding bits of the second write request;
determining, based on the decoded bits of the second write request, that data of the second write request should be written to the at least one high speed NVM only; and
writing the data of the second write request to the at least one high speed NVM.

17. The computer program product of claim 15, wherein the method performed by the processor further comprises:
monitoring for an I/O request;
determining whether the I/O request is a write request or a read request; and
transferring, in response to determining that the I/O request is the read request, data of the at least one high speed NVM to the at least one non-volatile memory.

18. The computer program product of claim 15, wherein the method performed by the processor further comprises:
monitoring for an I/O request to determine whether the I/O request is received at a first time;
transferring, in response to determining that the I/O request is not received at the first time, data of the at least one high speed NVM to the at least one non-volatile memory.

19. The computer program product of claim 16, wherein the non-volatile dual in-line memory module includes two high speed NVM's, wherein prior to writing, a determination is made which of the two high speed NVM's to write data of the write request to, the determination comprising:
determining a first amount of memory stored in a first high speed NVM of the two high speed NVM's;
determining a second amount of memory stored in a second high speed NVM of the two high speed NVM's;
comparing the first amount of memory stored in the first high speed NVM with the second amount of memory stored in the second high speed NVM; and
determining, in response to the first amount of memory stored in the first high speed NVM being less than the second amount of memory stored in the second high speed NVM, that the data of the write request should be written to the first high speed NVM and not the second high speed NVM, where writing includes writing data of the write request to the first high speed NVM and the at least one volatile memory simultaneously.

20. The computer program product of claim 15, wherein the volatile memory is dynamic random access memory (DRAM), wherein the high speed NVM is 3D XPoint memory, and wherein the non-volatile memory is flash memory.

* * * * *